United States Patent
Kanskar

(10) Patent No.: US 11,824,323 B1
(45) Date of Patent: Nov. 21, 2023

(54) DIODE LASER PACKAGE FOR BIDIRECTIONALLY EMITTING SEMICONDUCTOR LASER DEVICES

(71) Applicant: nLIGHT, Inc., Vancouver, WA (US)

(72) Inventor: Manoj Kanskar, Portland, OR (US)

(73) Assignee: nLIGHT, Inc., Camas, WA (US)

( * ) Notice: Subject to any disclaimer, the term of this patent is extended or adjusted under 35 U.S.C. 154(b) by 0 days.

(21) Appl. No.: 16/693,806

(22) Filed: Nov. 25, 2019

Related U.S. Application Data

(60) Provisional application No. 62/776,311, filed on Dec. 6, 2018.

(51) Int. Cl.
*H01S 5/024* (2006.01)
*H01S 5/028* (2006.01)
(Continued)

(52) U.S. Cl.
CPC ........ *H01S 5/02423* (2013.01); *H01S 5/0287* (2013.01); *H01S 5/02251* (2021.01); *H01S 5/02253* (2021.01); *H01S 5/02255* (2021.01); *H01S 5/4025* (2013.01); *H01S 5/4012* (2013.01); *H01S 5/4075* (2013.01); *H01S 5/4081* (2013.01)

(58) Field of Classification Search
None
See application file for complete search history.

(56) References Cited

U.S. PATENT DOCUMENTS

| | | | |
|---|---|---|---|
| 5,631,916 A | 5/1997 | Georges et al. | |
| 6,456,635 B1 * | 9/2002 | Shiomoto | H01S 5/4025 372/36 |

(Continued)

FOREIGN PATENT DOCUMENTS

| | | |
|---|---|---|
| IT | 0001426562 B1 | 12/2016 |
| WO | 9101056 A1 | 1/1991 |

(Continued)

OTHER PUBLICATIONS

Kanskar, Manoj, U.S. Appl. No. 17/373,684, filed Jul. 12, 2021, 41 pages.

(Continued)

*Primary Examiner* — Tod T Van Roy
(74) *Attorney, Agent, or Firm* — Stoel Rives LLP

(57) ABSTRACT

The disclosed diode laser packages include a carrier having an optics-mounting surface to which first and second sets of collimating and turning optics are mounted. The carrier includes a heatsink receptacle medially located between the first and second sets. A cooling plenum has a diode-mounting surface and includes heatsink material disposed in the heatsink receptacle. The cooling plenum further has an inlet, an outlet, and a coolant passageway defined between the inlet and the outlet. The coolant passageway is sized to receive the heatsink material disposed in heatsink receptacle. Multiple semiconductor laser diode devices are each mounted atop the diode-mounting surface and positioned for bidirectional emission toward the first and second sets of collimating and turning optics. The multiple semiconductor laser diode devices are thermally coupled to the heatsink material through which coolant is deliverable by the coolant passageway.

22 Claims, 10 Drawing Sheets

(51) Int. Cl.
*H01S 5/40* (2006.01)
*H01S 5/02251* (2021.01)
*H01S 5/02253* (2021.01)
*H01S 5/02255* (2021.01)

(56) References Cited

U.S. PATENT DOCUMENTS

| | | | | |
|---|---|---|---|---|
| 6,633,598 | B1* | 10/2003 | Kimizuka | H01S 5/02325 |
| | | | | 372/50.1 |
| 8,432,945 | B2* | 4/2013 | Faybishenko | G02B 6/4296 |
| | | | | 372/36 |
| 8,437,086 | B2* | 5/2013 | Du | H01S 5/405 |
| | | | | 359/629 |
| 9,166,369 | B2 | 10/2015 | Kanskar | |
| 9,214,786 | B2 | 12/2015 | Hemenway et al. | |
| 9,413,136 | B1* | 8/2016 | Vethake | H01S 5/024 |
| 9,455,552 | B1* | 9/2016 | Price | H01S 5/4075 |
| 9,647,416 | B2* | 5/2017 | Demir | H01S 5/4075 |
| 10,109,978 | B2* | 10/2018 | Kanskar | H01S 5/02251 |
| 10,243,320 | B2* | 3/2019 | Kanskar | H01S 5/4012 |
| 10,263,388 | B2* | 4/2019 | Takigawa | H01S 5/4025 |
| 10,283,939 | B2* | 5/2019 | Dawson | H01S 5/0236 |
| 10,763,640 | B2* | 9/2020 | Kanskar | H01S 5/4012 |
| 10,797,471 | B2* | 10/2020 | Dawson | H01S 5/0071 |
| 10,833,482 | B2* | 11/2020 | Chen | G02B 19/0057 |
| 10,862,265 | B2* | 12/2020 | Kanskar | H01S 5/02253 |
| 11,063,404 | B1* | 7/2021 | Kanskar | H01S 5/0653 |
| 2005/0063433 | A1* | 3/2005 | Treusch | H01S 5/4025 |
| | | | | 372/36 |
| 2006/0193353 | A1 | 8/2006 | Kim et al. | |
| 2009/0097511 | A1 | 4/2009 | Mohrdiek et al. | |
| 2010/0158060 | A1* | 6/2010 | Faybishenko | G02B 6/4206 |
| | | | | 372/98 |
| 2012/0002395 | A1 | 1/2012 | Du et al. | |
| 2012/0081893 | A1* | 4/2012 | Faybishenko | G02B 6/4296 |
| | | | | 362/294 |
| 2013/0146253 | A1* | 6/2013 | Daly | H01L 23/473 |
| | | | | 165/80.4 |
| 2014/0098829 | A1* | 4/2014 | Lewandowski | G01B 9/02091 |
| | | | | 372/20 |
| 2014/0219305 | A1 | 8/2014 | Fang et al. | |
| 2014/0301421 | A1 | 10/2014 | Kanskar | |
| 2016/0149379 | A1* | 5/2016 | Gotoda | H01S 5/0265 |
| | | | | 372/45.01 |
| 2016/0344160 | A1 | 11/2016 | Muller et al. | |
| 2017/0271837 | A1* | 9/2017 | Hemenway | H01S 3/09415 |
| 2017/0271843 | A1* | 9/2017 | Batchelder | B33Y 30/00 |
| 2017/0358900 | A1* | 12/2017 | Kanskar | H01S 5/02469 |
| 2018/0035877 | A1 | 2/2018 | Kinouchi et al. | |
| 2018/0123317 | A1 | 5/2018 | Kanskar et al. | |
| 2018/0166852 | A1* | 6/2018 | Nukui | H01S 5/0612 |
| 2018/0183214 | A1* | 6/2018 | Dawson | H01S 5/02469 |
| 2018/0191135 | A1* | 7/2018 | Yanase | H01S 5/4087 |
| 2018/0214978 | A1* | 8/2018 | Honda | B23K 26/0626 |
| 2018/0309264 | A1* | 10/2018 | Kanskar | H01S 5/02423 |
| 2018/0335582 | A1* | 11/2018 | Ishige | H01S 5/4025 |
| 2018/0358777 | A1 | 12/2018 | Chen et al. | |
| 2019/0212497 | A1* | 7/2019 | Hemenway | G02B 27/30 |
| 2019/0221990 | A1* | 7/2019 | Hemenway | H01S 3/10023 |

FOREIGN PATENT DOCUMENTS

| | | | |
|---|---|---|---|
| WO | 2006105249 | A2 | 10/2006 |
| WO | 2007004726 | A1 | 1/2007 |
| WO | 2011108038 | A1 | 9/2011 |
| WO | WO-2018200863 | A1 * | 11/2018 ......... H01S 3/06704 |

OTHER PUBLICATIONS

Search Report and Written Opinion for Italian Application No. TO2014A000852, dated Jun. 18, 2015, 9 pages.

\* cited by examiner

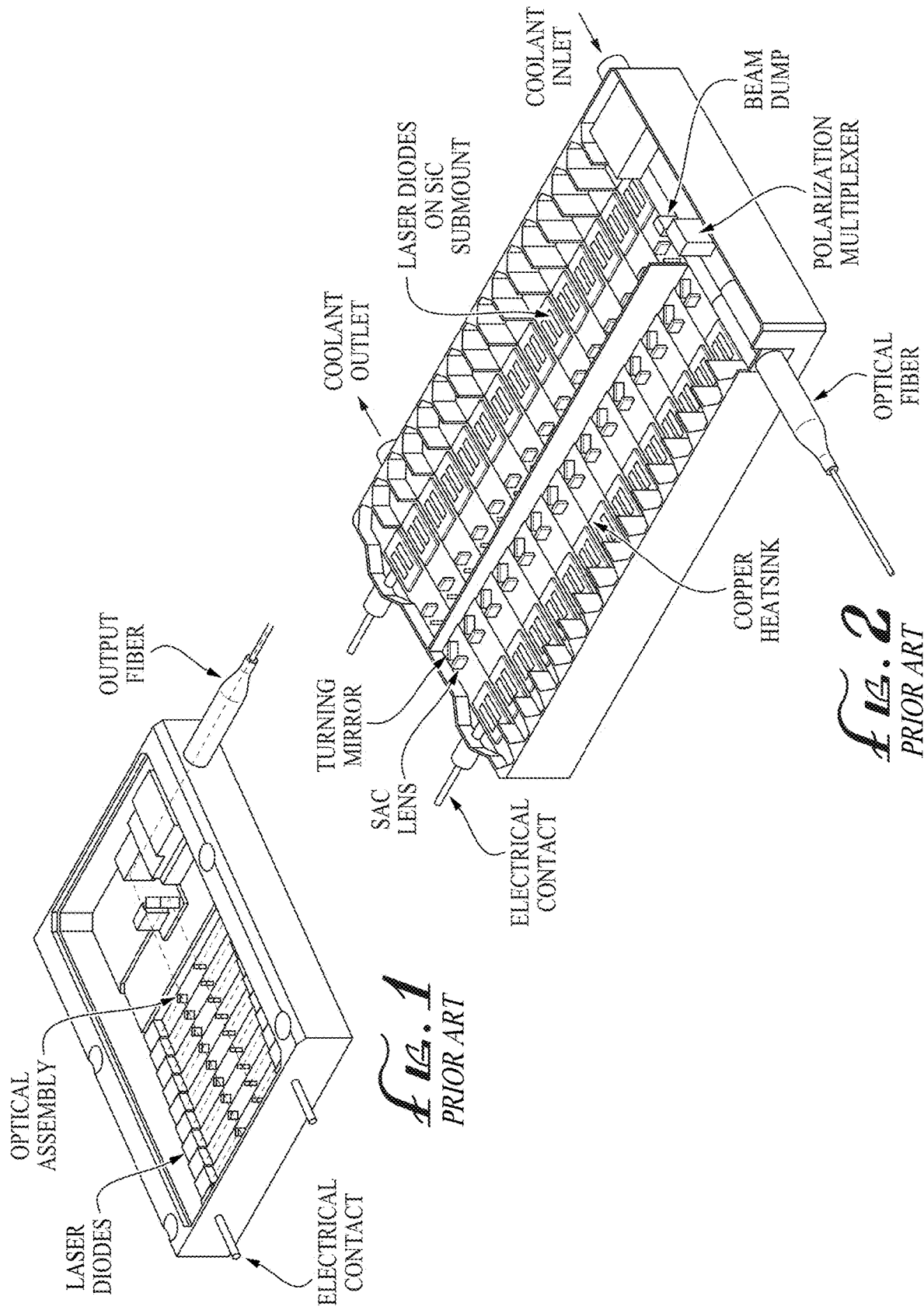

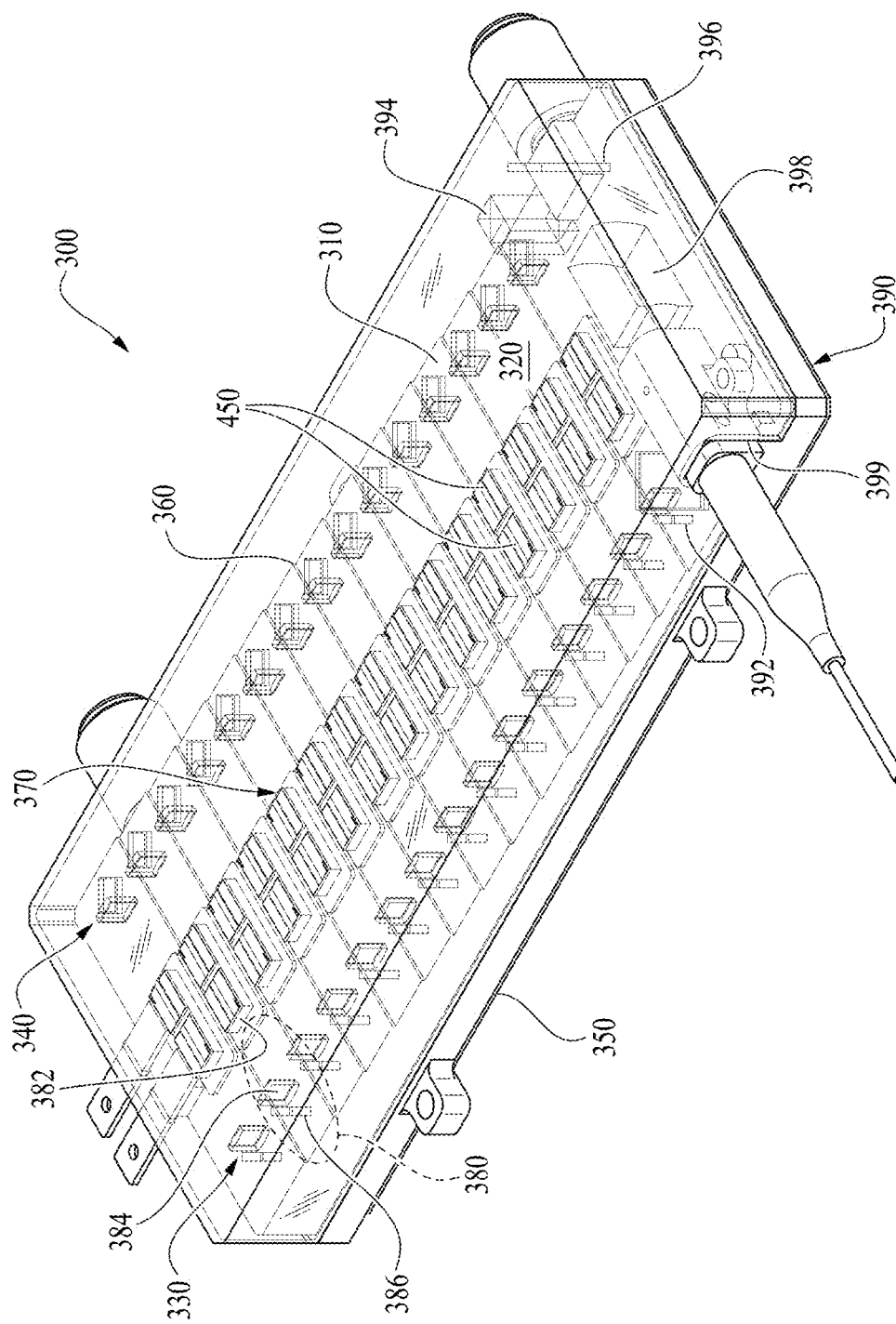

DIODE LASER PACKAGE FOR BIDIRECTIONALLY EMITTING SEMICONDUCTOR LASER DEVICES

RELATED APPLICATION

This application claims priority benefit of U.S. Provisional Patent Application No. 62/776,311, filed Dec. 6, 2018, which is hereby incorporated by reference.

TECHNICAL FIELD

This disclosure relates to low size and weight and power efficient (SWAP) pumps for directed energy or industrial applications.

BACKGROUND INFORMATION

Fiber-coupled diode laser pumps have been optimized for large volume industrial applications in which the primary metrics of performance are price-per-bright-watts and reliability (typically over multiple years of continuous, 24×7 use in industrial operating environments). While these metrics are also important for some military applications, current diode lasers optimized for industrial markets do not readily suit military applications having other metrics that take precedence, i.e., SWAP, efficiency, and reliable operation under harsh military conditions.

Specifically, there are three metrics for which there is a current technological gap between designs suited for military applications and those suited for industrial applications. First, industrial diode lasers are approximately kg/kW—too high for some military applications. Second, overall package volumes suitable for industrial applications are greater than two times that which would be acceptable for some high energy laser (HEL) applications. Third, industrial diode lasers are available at about 50% electrical-to-optical power conversion efficiency (PCE), whereas some HEL applications are satisfied by PCE 55%.

FIGS. 1 and 2 show, respectively, 2×9 and 2×15 opto-mechanical, conductively-cooled package designs for fiber-coupled diode laser pump topologies optimized for industrial applications and available from the present applicant, nLIGHT, Inc. of Vancouver, Washington. The 2×9 package design is an example of nLIGHT's Element® architecture including two outer rows of low SWAP laser diode (LSLD) assemblies that are the subject of the subject of U.S. patent application Ser. No. 15/498,422 of Kanskar et al., titled, "Low Size and Weight, High Power Fiber Laser Pump," filed Apr. 26, 2017 by nLIGHT, Inc. Laser diodes employed in the element architecture are arranged in a stair-step platform configuration and direct optical paths (indicated by red lines) with optics including a fast-axis collimator (FAC), a slow-axis collimator (SAC), a polarization multiplexer (PMUX), main turning mirror, telescope, and plano-convex focusing lens (PCX lens). The laser emissions are polarization multiplexed and face each other, i.e., spatially aligned front facets face each other along the two rows. The 2×15 package design is a low SWAP variant, similar to the element architecture in that it also includes two rows of LSLD assemblies that also face each other. Another architecture (not shown) developed by nLIGHT, Inc. is known as its Pearl™ architecture, characterized by facets that all face in a common direction.

Some other laser developers have attempted package designs employing devices having a so-called unfolded optical cavity for bidirectional lasing from opposing facets. Enhanced performance in terms of kg/kW, package volume, and PCE to meet specifications of certain applications, however, has remained a challenge.

SUMMARY OF THE DISCLOSURE

According to some embodiments, a diode laser package comprises a carrier having an optics-mounting surface to which first and second sets of collimating and turning optics are mounted, the carrier including a heatsink receptacle medially located between the first and second sets; a cooling plenum having a diode-mounting surface and including heatsink material disposed in the heatsink receptacle, the cooling plenum further having an inlet, an outlet, and a coolant passageway defined between the inlet and the outlet, the coolant passageway sized to receive the heatsink material disposed in heatsink receptacle; and multiple bidirectionally emitting semiconductor laser diode devices mounted atop the diode-mounting surface and positioned for bidirectional emission toward the first and second sets of collimating and turning optics, the multiple bidirectionally emitting semiconductor laser diode devices thermally coupled to the heatsink material through which coolant is deliverable by the coolant passageway.

Additional aspects and advantages will be apparent from the following detailed description of embodiments, which proceeds with reference to the accompanying drawings.

BRIEF DESCRIPTION OF THE DRAWINGS

FIGS. 1 and 2 are annotated isometric views of conventional diode laser packages.

FIGS. 3-5 are isometric views of a super-cooled, compact, and efficient diode (SuCCEeD, or SUCCEED) package having a stair step carrier of bidirectionally emitting chip-on-submount (COS) LSLD assemblies, in which an upper housing is shown as transparent in FIG. 3 and is not shown in partly exploded views of FIGS. 4 and 5.

DETAILED DESCRIPTION OF EMBODIMENTS

To address key technical gaps, this disclosure describes an ultra-low SWAP and efficient fiber laser (USE-FL) pump design having SUCCEED (i.e., bidirectionally emitting device) package technology. The technology includes a change from dense, but high thermal-conductivity copper housing to lighter materials while employing aspects of a well-vetted opto-mechanical design and topology of the element architecture of nLIGHT, Inc.

Unlike the element architecture, bidirectionally emitting semiconductor (BESt, or BEST) COS formations are employed. The BEST technology is the subject of U.S. Patent Application No. 62/730,886 and Ser. No. 16/570,297 of Kanskar, titled "Bidirectionally Emitting Semiconductor Laser Devices," filed, respectively, Sep. 13, 2018 and Sep. 13, 2019 by nLIGHT, Inc. In view of these applications, skilled persons will appreciate that the SUCCEED package embodiments described in this disclosure may employ either the single- or dual-chip bidirectionally emitting COS formations having any one or more of the described higher order mode suppression structures.

Figure 4:
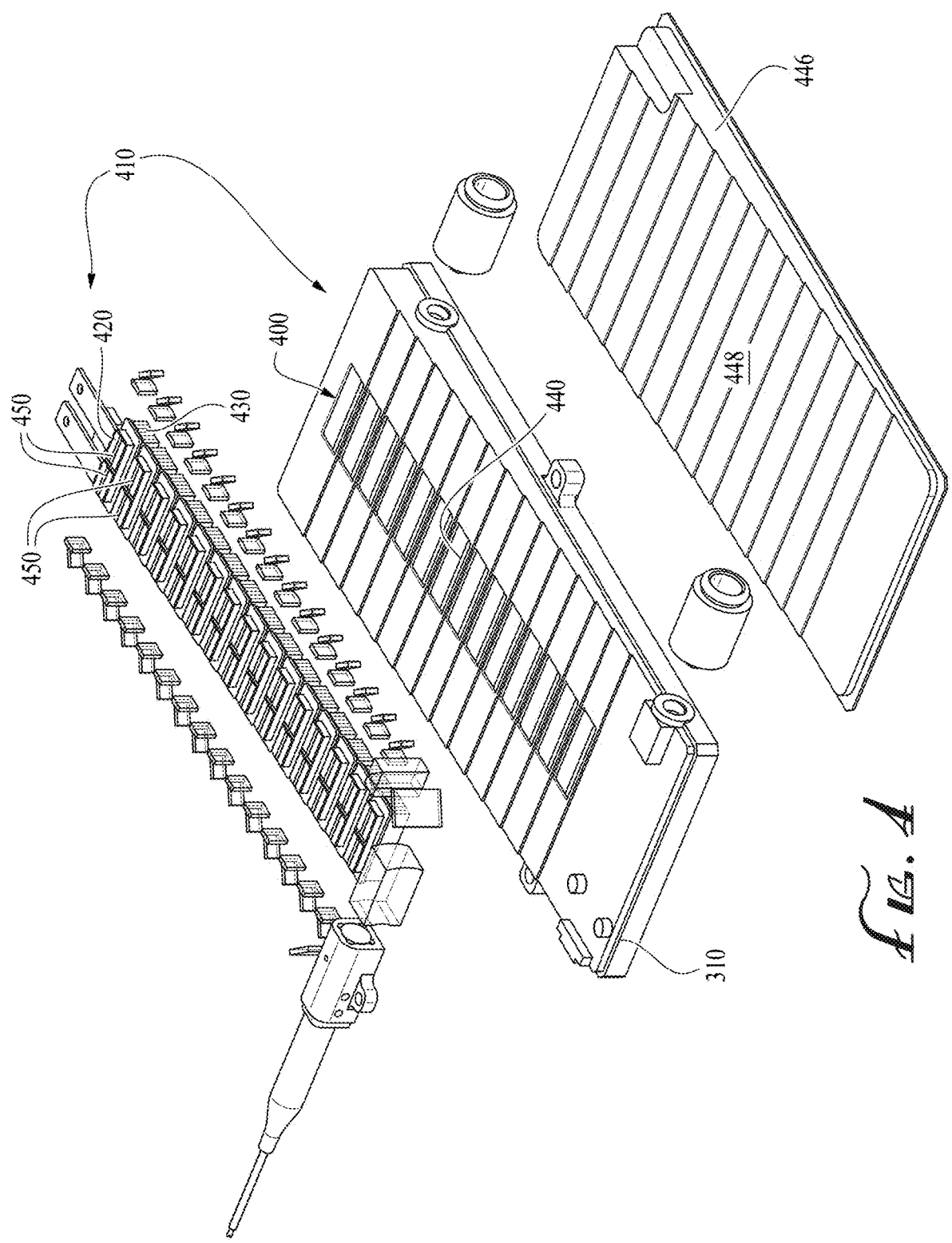
Figure 5:
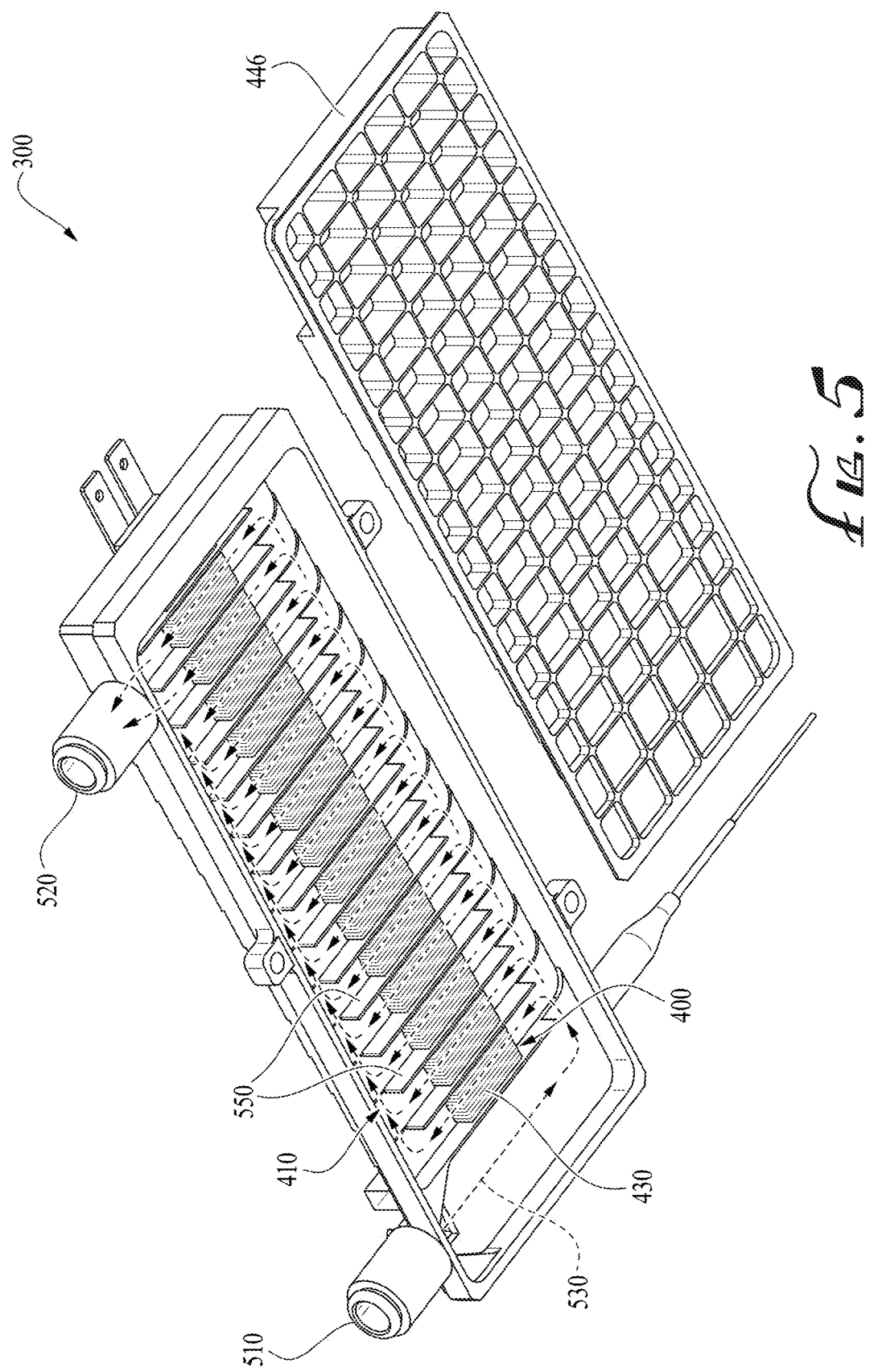

FIGS. 3-5 show a SUCCEED diode laser package 300, according to a first embodiment. Specifically, FIG. 3 shows a carrier 310 having an optics-mounting surface 320 in the form of multiple stair steps to which are mounted a first set of collimating and turning optics 330 and a second set of collimating and turning optics 340. First set 330 is proximally located to a first longitudinal side 350 of carrier 310. Second set 340 is proximally located to a second longitudinal side 360 opposite first side 350, according to one embodiment.

Each member of one of the sets 330, 340 corresponds to one of the bidirectional emitting facets of a BEST laser diode assembly 370 (15 assemblies are shown). For example, a particular member 380 of set 330 includes a FAC lens 382, a SAC lens 384, and a turning optic (e.g., mirror) 386. Also mounted on surface 320, toward a lateral fiber coupling region 390 of carrier 310, are a first main turning mirror 392 for redirecting a combined beam (not shown) delivered by set 330, a PMUX 394 for consolidating and redirecting the combined beams from set 340 and first turning mirror 392, a second main turning mirror 396 for redirecting consolidated beams, a magnification fast axis telescope (mFAT) optic 398, and a fiber-optic coupling assembly 399.

FIG. 4 is partly exploded to show that carrier 310 includes a heatsink receptacle 400 medially located between first and second sets 330, 340. FIG. 4 also shows in greater detail a first (e.g., upper) side of a cooling plenum 410. According to some embodiments, cooling plenum 410 includes a diode-mounting surface 420 and heatsink material 430 (e.g., copper fins and other heat-transfer surfaces) to be positioned in heatsink receptacle 400. According to some embodiments, and as shown in FIG. 4, heatsink receptacle 400 comprises a longitudinal row of laterally extending heatsink apertures 440. Cooling plenum 410 is enclosed by an under carriage 446 that also has a stair step surface 448 that, when under carriage 446 is mated to carrier 310, conforms to bottom sides of heatsink material 430 so as to define a coolant flow passageway that is described later.

Heatsink material 430 is configured to transfer heat generated by one or more of multiple bidirectionally emitting semiconductor laser diode devices 450. Heatsink material 430 may comprise any of a variety of materials such as aluminum silicon carbide (AlSiC), pyrolytic graphite, copper (Cu), aluminum (Al), or the like or any combinations thereof. In other embodiments, heatsink material 430 may be fabricated out of something completely different from conventional materials noted above. Additional description of heatsinks and heat transfer from COS devices is available in the '422 application.

Multiple bidirectionally emitting semiconductor laser diode devices 450 are mounted atop diode-mounting surface 420 and positioned for bidirectional emission toward first and second sets of collimating and turning optics 330, 340. As explained in the '886 and '297 applications and shown in FIGS. 3-5, each of multiple bidirectionally emitting semiconductor laser diode devices 450 comprises two semiconductor laser diodes (e.g., Fabry Perot (FP) diodes), each one of the two semiconductor laser diodes having a partly reflecting (PR) facet and a highly reflecting (HR) facet such that the HR facet of each semiconductor laser diode is arranged to confront the HR facet of the other semiconductor laser diode.

In another embodiment, multiple bidirectionally emitting semiconductor laser diode devices each comprises a semiconductor laser diode having opposing partly reflecting facets and a common optical cavity therebetween. In other words, devices 450 may include two back-to-back semiconductor laser diodes or a single chip having a common optical cavity between two opposing facets. Moreover, it should be appreciated that FP diodes are but one type of semiconductor laser and SUCCEED embodiments may employ other types of semiconductor lasers. For example, SUCCEED may employ distributed feedback (DFB) grating or distributed Bragg reflection (DBR) grating semiconductor lasers or, in other embodiments, monolithic master oscillator and power amplifier (MOPA) devices.

As noted previously with respect to FIG. 3, each one of multiple bidirectionally emitting semiconductor laser diode devices 450 comprises an assembly (i.e., BEST assembly 370) including a COS formation and a heatsink disposed in a different one of laterally extending heatsink apertures 440. For example, FIG. 5 shows another view of a second (e.g., under) side of cooling plenum 410, in which heatsink material 430 is shown disposed in heatsink receptacle 400. Cooling plenum 410 has an inlet 510, an outlet 520, and a coolant passageway 530 defined between inlet 510 and outlet 520. In some embodiments, inlet 510 and outlet 520 are located on a common side (e.g., side 360, FIG. 3) of carrier 310.

Coolant passageway 530 is sized to receive heatsink material 430 disposed in heatsink receptacle 400 such that multiple bidirectionally emitting semiconductor laser diode devices 450 (FIG. 4) are thermally coupled to heatsink material 430 through which coolant (e.g., air flow, water, ethylene-glycol-water mixture, propylene-glycol mixture, or other coolants) is deliverable by coolant passageway 530. Coolant passageway 530 is located at least partly underneath diode-mounting surface 420, but other arrangements are also possible.

FIG. 5 also shows that coolant passageway 530 is configured to maintain a flow direction through heatsink material 430 that is the same for each one of the multiple bidirectionally emitting semiconductor laser diode devices 450 (FIG. 4). In other words, the flow direction through heatsink material 430 is from a cooler intake side (i.e., from side 350) to a hotter exhaust side (i.e. to side 360) so as to avoid serpentine changes in direction among different heatsink material 430. Also, the flow direction is perpendicular with respect to planes defined by facets of multiple bidirectionally emitting semiconductor laser diode devices 450.

To provide for a relatively even distribution of coolant flow (i.e., to avoid hot spots and areas of high or low pressure), cooling plenum 410 includes multiple baffles 550 extending in coolant passageway 530 and spaced apart from each other. Baffles 550 also help maintain the flow direction through separate heatsinks comprising heatsink material 430. In other words, baffles 550 define coolant flow channels for each assembly 370.

Figure 6:
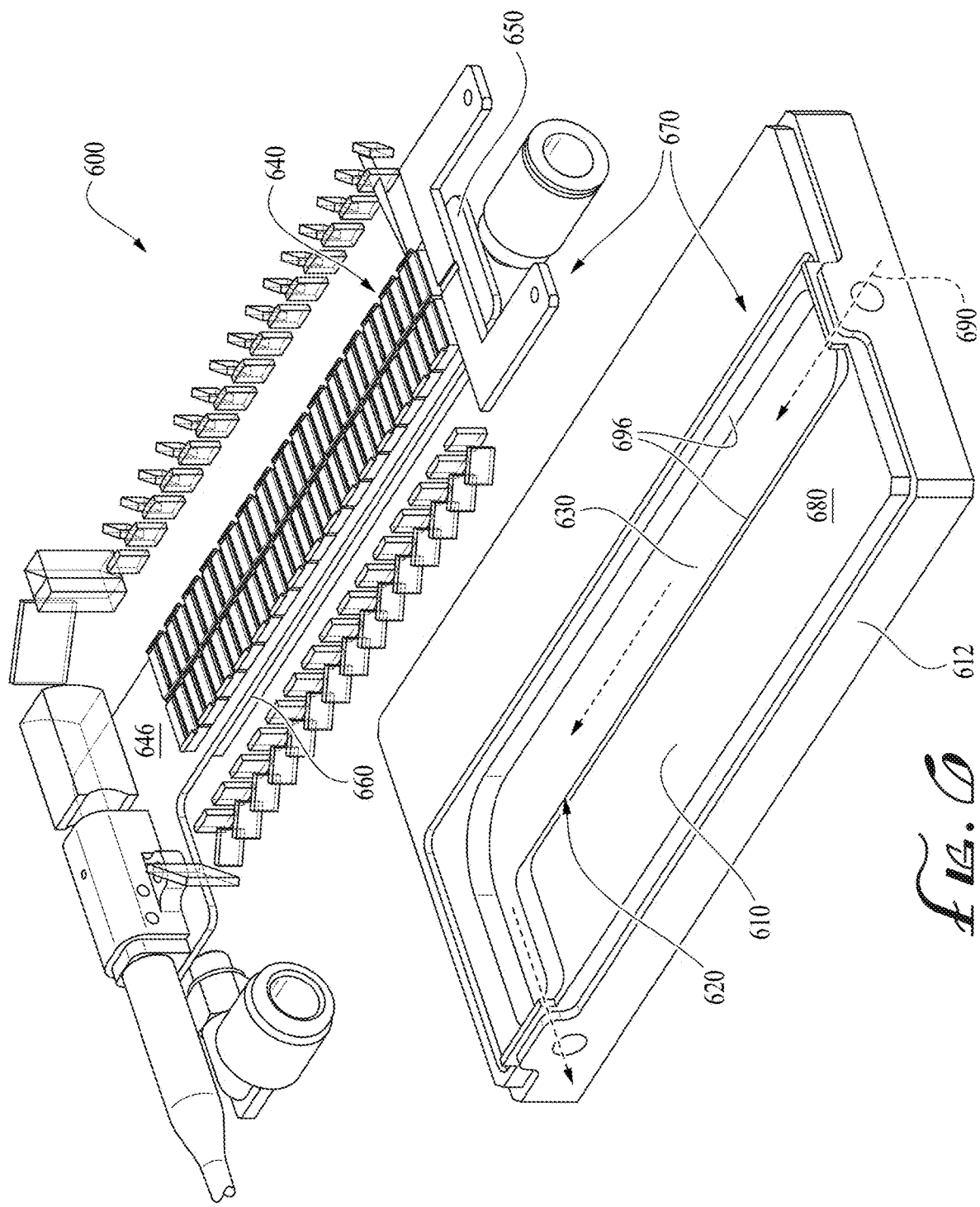
FIGS. 6-9 are two pairs of isometric views of a SUCCEED package, according to second (FIGS. 6 and 7) and third (FIGS. 8 and 9) embodiments, in which upper housings (lids) are not shown in FIGS. 6 and 8 and both upper and lower housings are not shown in FIGS. 7 and 9.

FIG. 6 shows a SUCCEED diode laser package 600, according to a second embodiment. Package 600 includes a carrier 610 having a unitary body 612 (c.f., the multi-component body of package 300, FIG. 3) and a heatsink receptacle 620 that comprises an L-shaped channel 630 recessed in body 612. Thus, instead of having a discrete heatsink assembly for each COS device (see, e.g., FIGS.

3-5), multiple COS devices 640 are mounted atop an (upper) heat-transfer surface 646 of an elongate, monolithic copper heatsink device 650.

Figure 7:
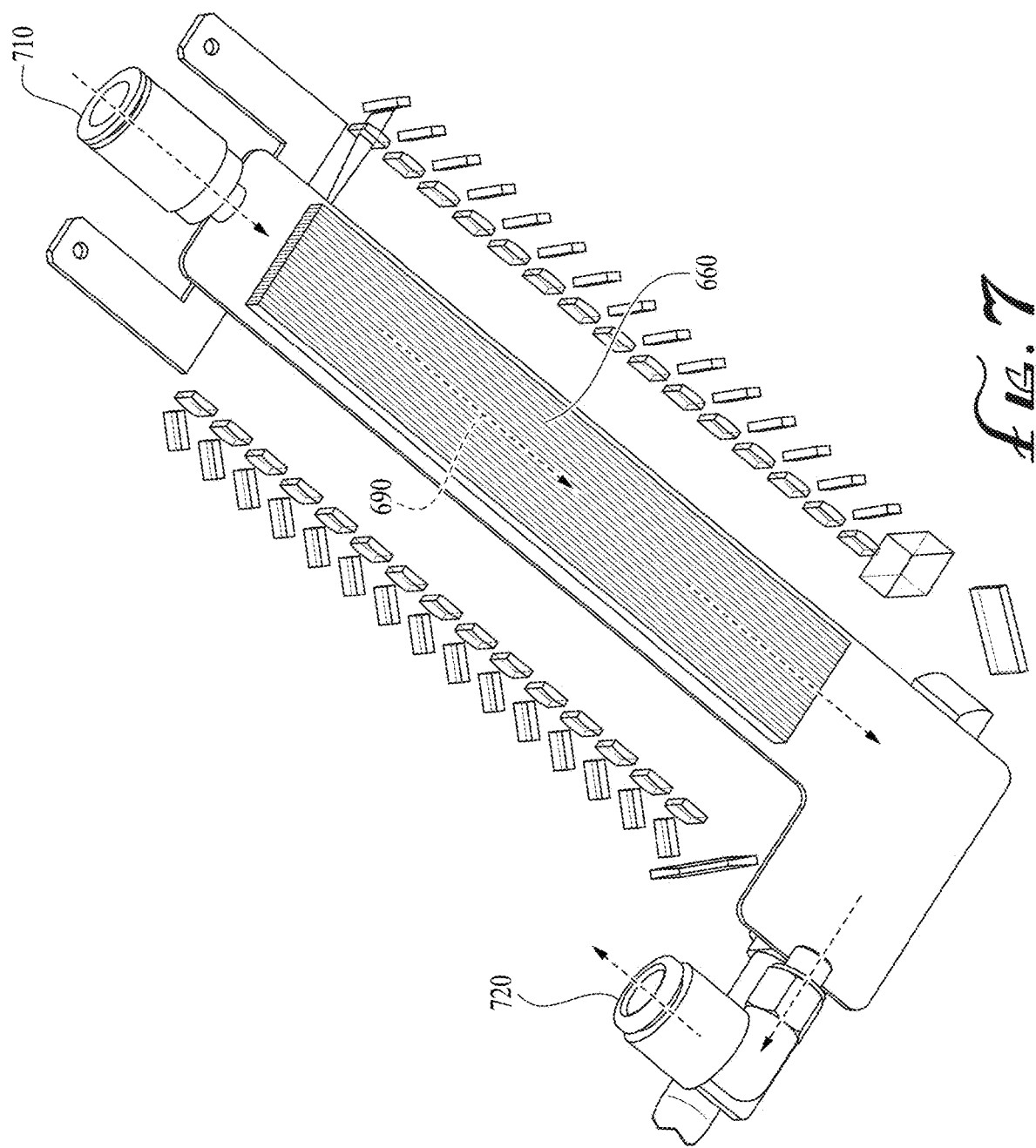

Underneath surface 646 is heatsink material 660 (see e.g., texture shown in FIG. 7 representing fins described in the '422 application) sized to be disposed in channel 630 so as to form cooling plenum 670 when heatsink device 650 is flush mounted to body 612 by fasteners (e.g., screws). For example, screws detachably secure heatsink device 650 and thereby allow it to be removed for a variety of purposes, including replacement of parts.

An optics mounting surface 680 of body 612 is a planar, i.e., non-stair stepped, surface. Because surface 680 is flat, fiber optic coupling of multiple beams emitted using this non-stair step configuration is enabled by angling individual beams using offset and angled FAC lenses, which are described later with reference to FIGS. 11 and 12. Skilled persons will appreciate, however, that cooling plenum 670 (as well as those of other non-stair step embodiments shown in FIGS. 8-10) may be deployed in stair step configurations. Likewise, individual heatsinks and COS assemblies described with reference to the embodiment shown in FIGS. 3-5 may also be used in the embodiments described with reference to FIGS. 6-10.

A coolant passageway 690 is shown in dashed lines in both FIGS. 6 and 7. When assembled, a flow direction through heatsink material 660 is maintained such that the flow direction is parallel to planes defined by facets of the multiple bidirectionally emitting semiconductor laser diode devices 640. In other words, channel 630 of body 612 provides sidewalls 696 to guide coolant through coolant passageway 690 integrally formed in body 612. Accordingly, as shown in FIG. 7, coolant flows directly from an inlet 710 and associated orifice(s) in body 612, through heatsink material 660, and outward through outlet 720 and associated orifice(s) in body 612.

Figure 8:
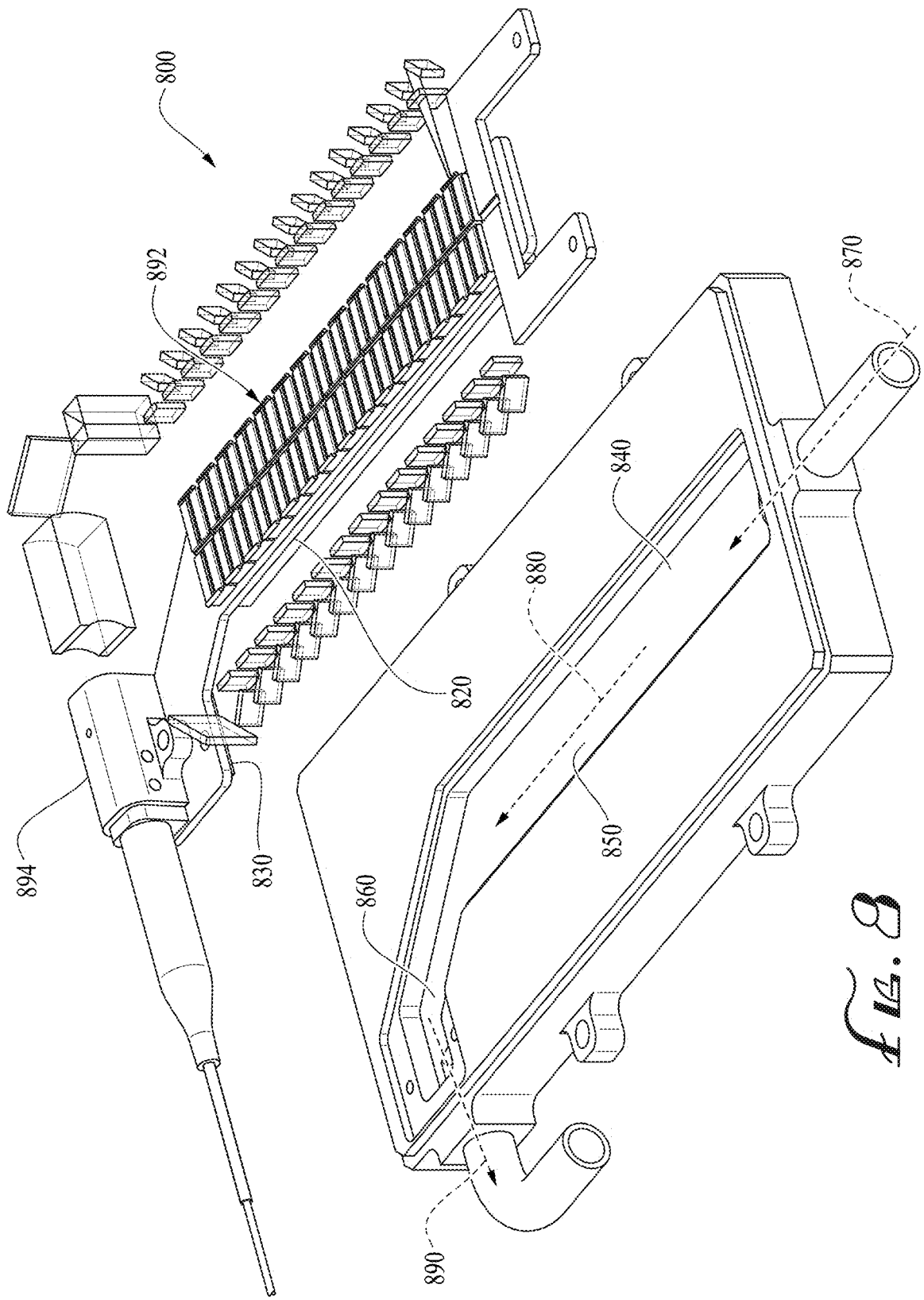
Figure 9:
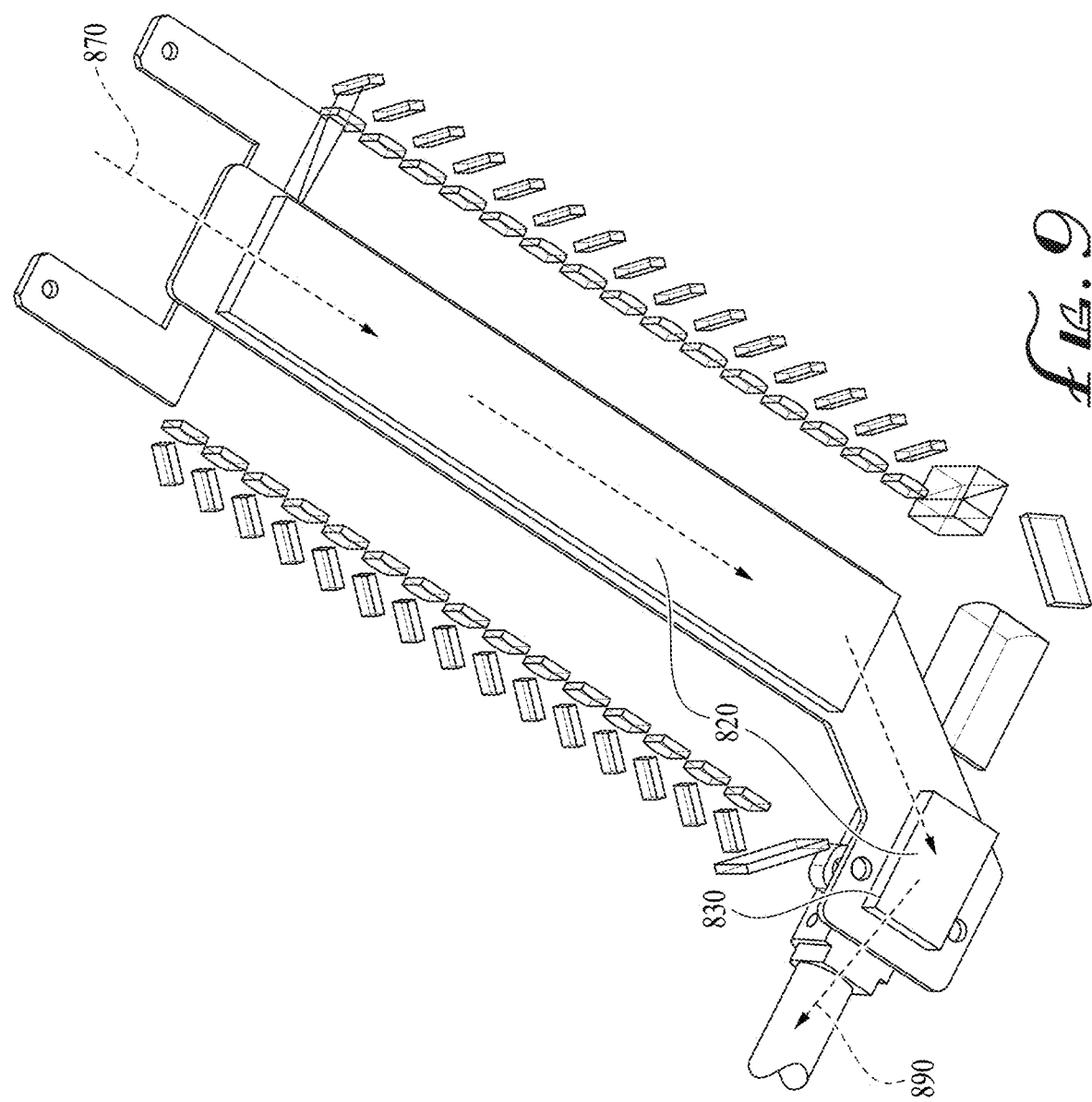

Another embodiment shown in FIGS. 8 and 9 is similar to that shown in FIGS. 6 and 7. A difference, however, is that a package 800 has heatsink material 820 including a separate, fiber-optic coupling assembly heatsink 830 (shown in greater detail in FIG. 9). Thus, a channel 840 includes a first section 850 and a second section 860. Likewise, a coolant passageway 870 includes a first portion 880 and a second portion 890 for cooling, respectively, bidirectionally emitting semiconductor laser diode devices 892 mounted along first section 850 of channel 840 and a fiber-optic coupling assembly 894 mounted along second section 860 of channel 840. Second portion 890 is sized to receive fiber-optic coupling assembly heatsink 830 disposed in second section 860.

First and second sections 850, 860 are (but need not be in other embodiments) perpendicular to each other. In other words, first portion 880 of coolant passageway 870 is configured to maintain a first flow direction that is parallel to planes defined by facets of multiple bidirectionally emitting semiconductor laser diode devices 892, and second portion 890 of coolant passageway 870 is configured to maintain a second flow direction that is transverse to the first flow direction.

Another difference between the embodiment of FIGS. 6 and 7 and that of FIGS. 8 and 9 is that the latter primarily maintains optics mounted atop one type of material (e.g., aluminum). In other words, there is no set of optics on aluminum while another set is on copper. In contrast, an mFAT optic shown in FIG. 7 is mountable atop copper whereas other optics are mountable atop aluminum.

Figure 10:
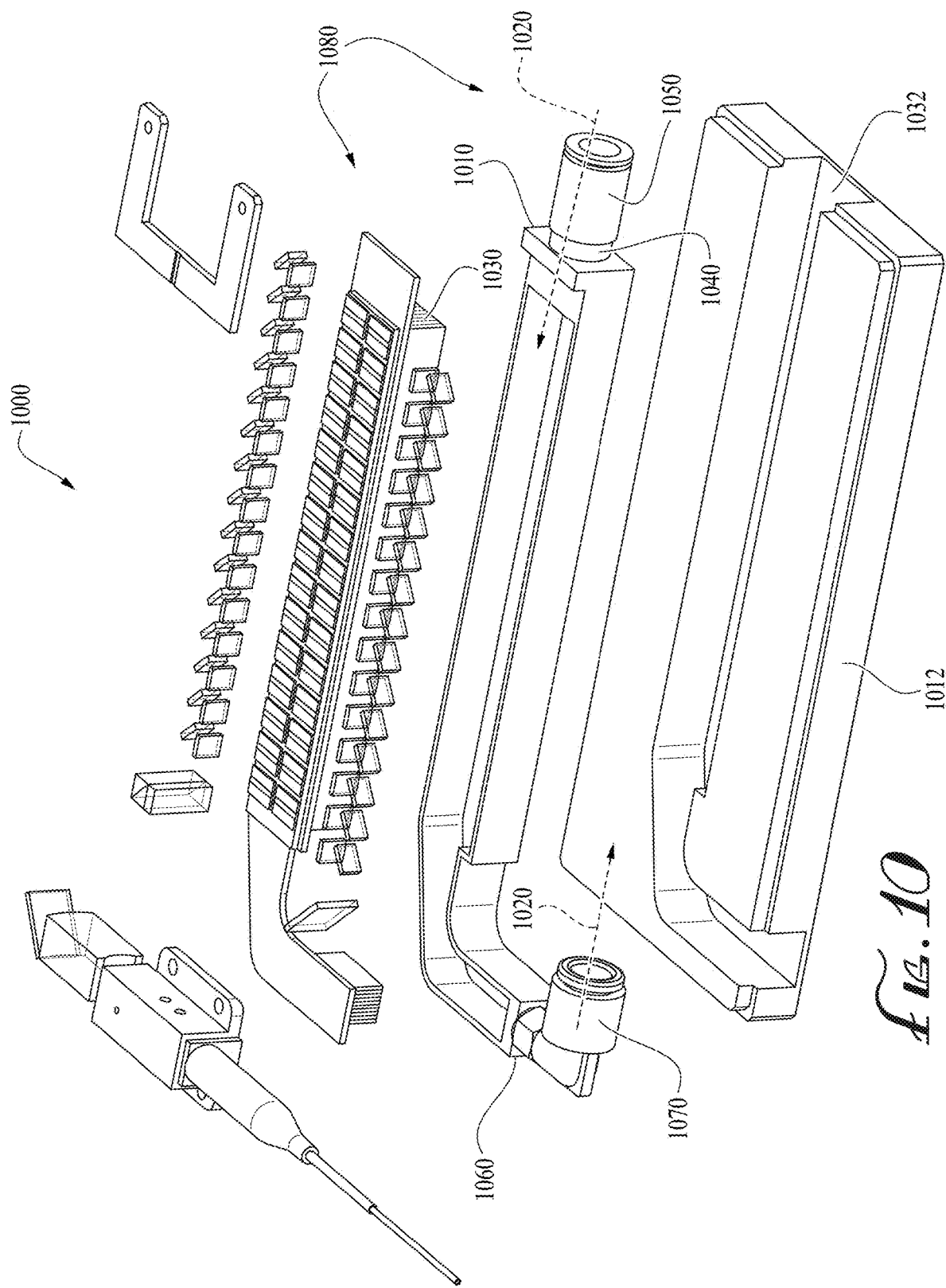
FIG. 10 is a partly exploded isometric view of a SUCCEED package, according to fourth embodiment.

FIG. 10 shows a SUCCEED diode laser package 1000, according to a fourth embodiment. Compared to package 600, i.e., which includes sidewalls 696 integrally milled in body 612, package 1000 includes a plenum container 1010 that is removable from a body 1012, defines a self-contained coolant passageway 1020, and encompasses heatsink material 1030. Plenum container 1010 is at least partly matable with a channel 1032 of body 1012 so as to guide coolant through coolant passageway 1020 sealed within plenum container 1010. Also, plenum container 1010 is coupled directly to an inlet orifice 1040 providing an inlet 1050 and an outlet orifice 1060 providing an outlet 1070 of a cooling plenum 1080.

Figure 11:
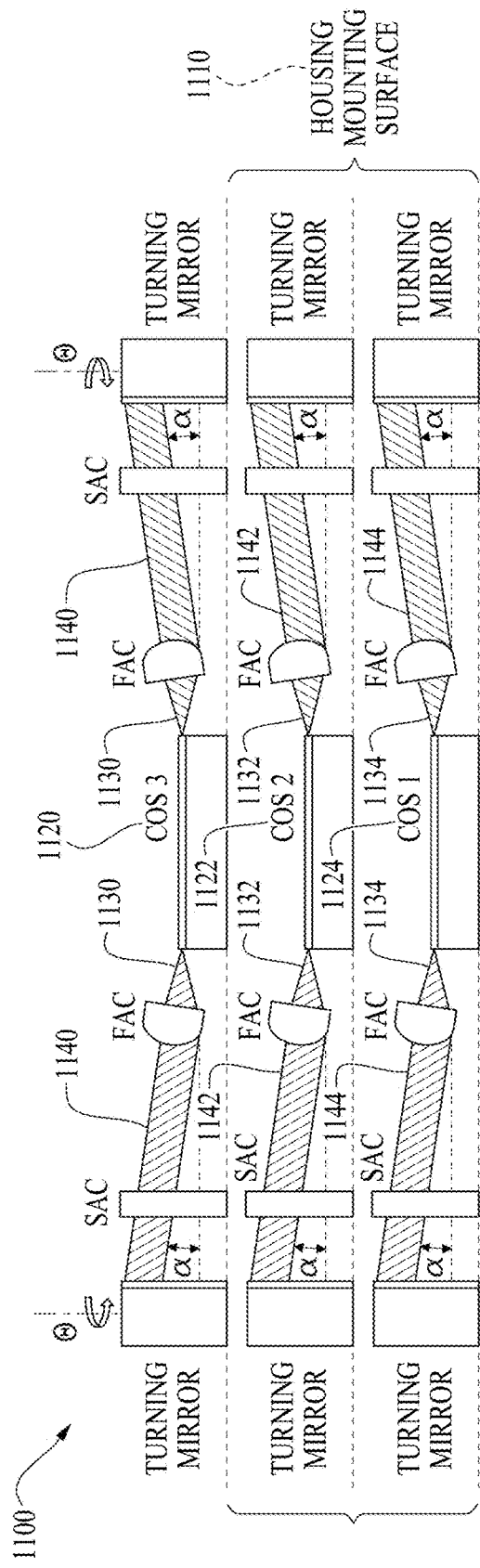
FIGS. 11 and 12 are, respectively, a set of three end views and a side elevation view, in which the end views of FIG. 11 are shown vertically displaced from each other for the purpose of showing bidirectionally emitting COS LSLD assemblies that are actually positioned on a flat surface (i.e., non-stair step configuration, FIG. 12) and employing angled FAC lenses.

FIG. 11 shows a modified end view of a carrier 1100 having a planar horizontal plane/housing mounting surface 1110 (dashed lines in FIGS. 11 and 12) which carries three bidirectionally emitting COS devices 1120, 1122, and 1124 and corresponding sets of optics for bidirectional laser beam delivery to a fiber-coupling assembly. (Note, in an actual end view, one COS and its associated optics would occlude the other two, so in FIG. 11 each COS device and its optics are shown as vertically offset even though they are mounted on a flat surface.) As described previously, each emitting facet of a COS device bidirectionally emits beams 1130, 1132, and 1134 toward corresponding sets of collimating and turning optics (e.g., sets 330 and 340 of FIG. 3). In other words, each COS device is located between a pair of FAC lenses, a pair of SAC lenses, and a pair of turning mirrors.

Because beams 1130, 1132, and 1134 are all emitted along a flat plane, i.e., surface 1110 is not stair stepped, FAC lenses, which collimate diode laser beams in the fast axis, are tilted so as to steer laser beam emission 1140, 1142, and 1144 out of the initial emission plane by an angle α. SAC lenses then collimate the beams in the slow axis and need not change the beam direction in the fast axis. In other words, the emitted diode laser beams are parallel to each other, but are steered at an angle α out of the emission plane before reaching turning mirrors. The laser beams are vertically stacked as achieved by the previously described stair-step packages but stacked by optics instead of mechanical steps.

Figure 12:
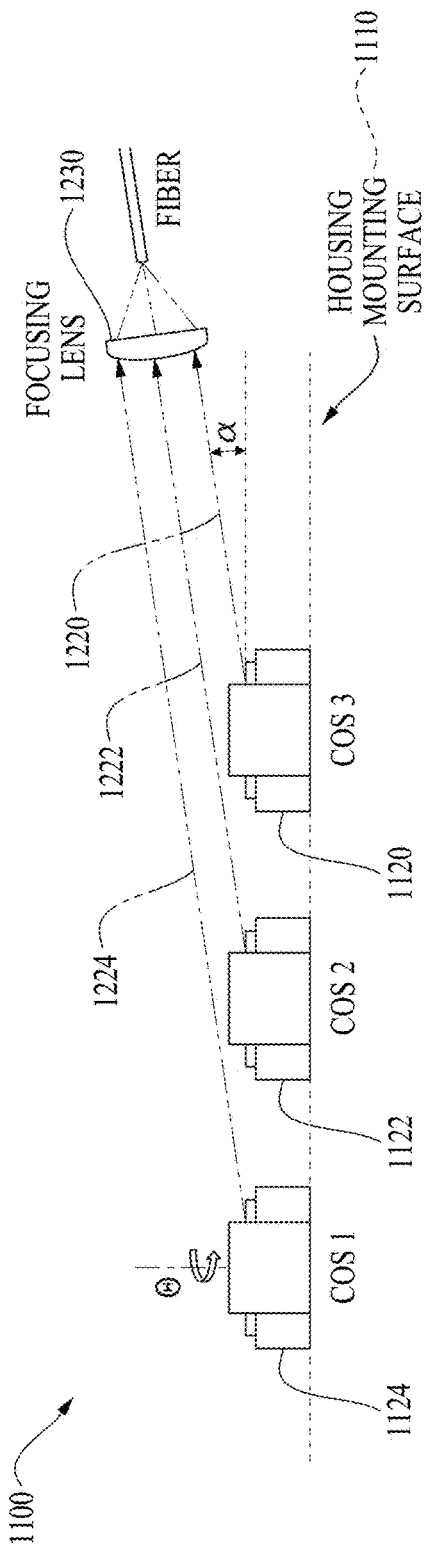

FIG. 12 shows a side elevation view of carrier 1100 and COS devices 1120, 1122, and 1124 placed on planar horizontal plane 1110 and mutually displaced along the slow axis direction. (In the side view, turning mirrors occlude SAC and FAC lenses.) The turning mirrors have reflective planar surfaces that are perpendicular to housing mounting surface 1110. Also, the turning mirrors are rotated by an angle θ around the axis perpendicular to horizontal plane 1110, so that out-of-plane collimated beams 1220, 1222, and 1224, are reflected at an azimuthal angle of 2θ. The particular example has an azimuthal angle of ~90°, but other angles are also possible.

Because the turning mirrors are perpendicular to the housing mounting surface, the out-of-plane beam angle remains the same after collimated beams are reflected by the turning mirrors. Moreover, the diode laser beams reflect into a stacked configuration (e.g., stacked along the fast axis) before reaching a focusing lens 1230 (and associated optics that are not shown, e.g., PMUX) combining first and second beam stacks from the two bidirectionally emitting facets into an optical fiber.

The out-of-plane beam angle is selected such that one beam in the stack lies as closely as possible to the adjacent beams without substantial impingement on the turning mirror for the next laser beam. Too small of an angle can cause substantial beam clipping by the turning mirror and result in power loss, but too large of an angle can increase the NA of the beam stack and reduce the brightness of the beam stack. One example for an optimized out-of-plane stacking technique employs a fast axis steering angle of 4.7°, which provides a beam offset of 450 μm in the fast axis direction for two turning mirrors 5.5 mm apart (both 450 μm step size and 5.5 mm turning mirror separation are feasible configurations for stair-step packages of nLIGHT, Inc.).

In some embodiments, a combination of FAC offset and rotation is used to achieve steering of received beams. The COSs can be mounted onto mounting blocks (similar to supercarriers in stair step packages to enable modular integration), which are then mounted onto the housing mounting surface. They can also be attached directly onto the housing mounting surface, as in the case in FIGS. 11 and 12. The diode chip can be attached as close to the housing mounting surface as the FAC lens allows mechanically; the upwardly steered beam prevents beam impinging on the mounting surface due to the finite residual fast axis beam divergence, as well as relieves the height restraint on turning mirrors (turning mirrors need not to be very short to avoid beam clipping for beams very close to the mounting surface). This typically allows superior heat dissipation from the diodes to the heatsink, leading to improved diode performance.

Skilled persons will appreciate that many changes may be made to the details of the above-described embodiments without departing from the underlying principles of the invention. For example, common to each of the embodiments of FIGS. 6-10 are inlets and outlets formed in, respectively, first and second sides of a body, in which the first side is different from (e.g., perpendicular to) the second side. The scope of the present invention should, therefore, be determined only by the following claims

The invention claimed is:

1. A diode laser package, comprising:
   a carrier having an optics-mounting surface to which first and second sets of collimating and turning optics are mounted, the carrier including a heatsink receptacle medially located between the first and second sets; and
   a cooling plenum having a diode-mounting surface and including heatsink material disposed in the heatsink receptacle, the cooling plenum further having an inlet, an outlet, and a coolant passageway defined between the inlet and the outlet, the coolant passageway sized to receive the heatsink material disposed in heatsink receptacle;
   in which the coolant passageway is configured to maintain a uniform flow direction through the heatsink material that is the same direction with respect to each one of multiple semiconductor laser diode devices,
   in which each one of the multiple semiconductor laser diode devices is mounted atop the diode-mounting surface and is positioned for bidirectional emission toward the first and second sets of collimating and turning optics, the multiple semiconductor laser diode devices being thermally coupled to the heatsink material through which coolant is deliverable by the coolant passageway, and
   in which each one of the multiple semiconductor laser diode devices defines a distance between bidirectional facets with the heatsink material being continuous across the distance.

2. The diode laser package of claim 1, in which the coolant passageway is located at least partly underneath the diode-mounting surface.

3. The diode laser package of claim 1, in which the heatsink receptacle comprises a longitudinal row of laterally extending heatsink apertures.

4. The diode laser package of claim 3, in which each one of the multiple semiconductor laser diode devices further comprises an assembly including a chip on submount (COS) formation and a heatsink disposed in a different one of the laterally extending heatsink apertures.

5. The diode laser package of claim 3, in which the carrier comprises a stair step platform of multiple steps, each stair step of the multiple steps having a corresponding different one of the laterally extending heatsink apertures through which a corresponding different one of the multiple semiconductor laser diode devices is mounted.

6. The diode laser package of claim 1, in which the inlet and the outlet are located on a common side of the carrier.

7. The diode laser package of claim 1, in which each one of the multiple semiconductor laser diode devices comprises two semiconductor laser diodes having optical cavities that are separate from each other, each one of the two semiconductor laser diodes having a partly reflecting facet and highly reflecting (HR) facet, the HR facet of each semiconductor laser diode arranged to confront the HR facet of the other semiconductor laser diode.

8. The diode laser package of claim 1, in which each of the multiple semiconductor laser diode devices comprises a semiconductor laser diode having opposing partly reflecting facets and a common optical cavity therebetween.

9. The diode laser package of claim 1, in which the uniform flow direction is perpendicular with respect to planes defined by facets of the multiple semiconductor laser diode devices.

10. The diode laser package of claim 1, in which the cooling plenum includes multiple baffles extending in the coolant passageway and spaced apart from each other to maintain the uniform flow direction through separate heatsinks comprising the heatsink material.

11. The diode laser package of claim 1, in which the carrier includes a body and the heatsink receptacle comprises a channel recessed in the body.

12. The diode laser package of claim 11, in which the uniform flow direction is parallel to planes defined by facets of the multiple semiconductor laser diode devices.

13. The diode laser package of claim 11, in which the channel provides sidewalls to guide the coolant through the coolant passageway integrally formed in the body.

14. The diode laser package of claim 11, in which the inlet and the outlet are formed in, respectively, first and second sides of the body, the first side being different from the second side.

15. The diode laser package of claim 14, in which the first and second sides are perpendicular to each other.

16. The diode laser package of claim 11, in which the channel includes first and second sections and the coolant passageway includes first and second portions for cooling, respectively, the multiple semiconductor laser diode devices mounted along the first section of the channel and a fiber-optic coupling assembly mounted along the second section of the channel.

17. The diode laser package of claim 16, in which the first and second sections are perpendicular to each other.

18. The diode laser package of claim 16, in which the second portion is sized to receive a fiber-optic coupling assembly heatsink disposed in the second section of the channel.

19. The diode laser package of claim 16, in which the first portion of the coolant passageway is configured to maintain the uniform flow direction that is parallel to planes defined by facets of the multiple semiconductor laser diode devices, and the second portion of the coolant passageway is configured to maintain a second flow direction that is transverse to the uniform flow direction.

20. The diode laser package of claim 11, further comprising a plenum container defining the coolant passageway and encompassing the heatsink material, the plenum container being at least partly matable with the channel to guide the coolant through the coolant passageway.

21. The diode laser package of claim 20, in which the plenum container is coupled directly to an inlet orifice providing the inlet and an outlet orifice providing the outlet.

22. The diode laser package of claim 11, in which the carrier comprises a flat-top platform defining a plane, and at least a portion of the collimating optics of the first and second sets of collimating and turning optics is arranged to impart angles to emitted optical beams so as to steer the emitted optical beams out of the plane defined by the flat-top platform.

\* \* \* \* \*